(12) United States Patent
Wong et al.

(10) Patent No.: US 8,185,242 B2
(45) Date of Patent: May 22, 2012

(54) DYNAMIC ALIGNMENT OF WAFERS USING COMPENSATION VALUES OBTAINED THROUGH A SERIES OF WAFER MOVEMENTS

(75) Inventors: Scott Wong, Sunnyvale, CA (US); Jeffrey Lin, Hsinchu (TW); Andrew D. Bailey, III, Pleasanton, CA (US); Jack Chen, Fremont, CA (US); Benjamin W. Mooring, Cedar Park, TX (US); Chung Ho Huang, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 871 days.

(21) Appl. No.: 12/116,897

(22) Filed: May 7, 2008

(65) Prior Publication Data

US 2009/0279989 A1 Nov. 12, 2009

(51) Int. Cl.
- *G06F 19/00* (2011.01)
- *G06F 17/00* (2006.01)
- *G05B 19/18* (2006.01)
- *G05B 15/00* (2006.01)
- *G05B 19/00* (2006.01)

(52) U.S. Cl. ........ 700/254; 700/114; 700/245; 700/264; 901/3; 901/40; 901/46

(58) Field of Classification Search .................. 700/114, 700/245, 250, 254, 264; 901/3, 40, 46
See application file for complete search history.

(56) References Cited

U.S. PATENT DOCUMENTS

| | | | | |
|---|---|---|---|---|
| 5,483,138 A | * | 1/1996 | Shmookler et al. | 318/568.16 |
| 5,535,306 A | * | 7/1996 | Stevens | 700/254 |
| 5,563,798 A | * | 10/1996 | Berken et al. | 700/218 |
| 5,980,194 A | * | 11/1999 | Freerks et al. | 414/754 |
| 6,035,245 A | * | 3/2000 | Conboy et al. | 700/214 |
| 6,075,334 A | * | 6/2000 | Sagues et al. | 318/568.11 |
| 6,356,804 B1 | * | 3/2002 | Conboy et al. | 700/228 |
| 6,615,093 B1 | * | 9/2003 | Chung et al. | 700/100 |
| 6,629,053 B1 | * | 9/2003 | Mooring | 702/94 |
| 6,647,316 B2 | * | 11/2003 | Bahri et al. | 700/217 |
| 6,662,076 B1 | * | 12/2003 | Conboy et al. | 700/214 |
| 6,748,282 B2 | * | 6/2004 | Lin | 700/95 |
| 6,763,281 B2 | * | 7/2004 | Schauer et al. | 700/218 |
| 6,934,606 B1 | * | 8/2005 | Genetti et al. | 700/254 |
| 7,151,980 B2 | * | 12/2006 | You et al. | 700/214 |
| 7,158,857 B2 | * | 1/2007 | Schauer et al. | 700/218 |

(Continued)

FOREIGN PATENT DOCUMENTS

JP 2004-174669 6/2004

(Continued)

*Primary Examiner* — Ronald Hartman, Jr.

(74) *Attorney, Agent, or Firm* — Martine Penilla Group, LLP

(57) ABSTRACT

Methods and systems to optimize wafer placement repeatability in semiconductor manufacturing equipment using a controlled series of wafer movements are provided. In one embodiment, a preliminary station calibration is performed to teach a robot position for each station interfaced to facets of a vacuum transfer module used in semiconductor manufacturing. The method also calibrates the system to obtain compensation parameters that take into account the station where the wafer is to be placed, position of sensors in each facet, and offsets derived from performing extend and retract operations of a robot arm. In another embodiment where the robot includes two arms, the method calibrates the system to compensate for differences derived from using one arm or the other. During manufacturing, the wafers are placed in the different stations using the compensation parameters.

22 Claims, 18 Drawing Sheets

U.S. PATENT DOCUMENTS

| | | | |
|---|---|---|---|
| 7,194,332 B2 * | 3/2007 | Fukunari | 700/228 |
| 7,205,742 B2 * | 4/2007 | Adachi et al. | 318/567 |
| 7,210,246 B2 * | 5/2007 | van der Meulen | 34/467 |
| 7,307,695 B2 * | 12/2007 | Hazenberg et al. | 355/72 |
| 7,353,076 B2 * | 4/2008 | Nagayasu et al. | 700/112 |
| 7,387,484 B2 * | 6/2008 | Ho et al. | 414/217 |
| 7,433,759 B2 * | 10/2008 | Nangoy | 700/245 |
| 7,505,832 B2 * | 3/2009 | Suh et al. | 700/264 |
| 7,627,395 B2 * | 12/2009 | Sadighi et al. | 700/245 |
| 7,664,561 B1 * | 2/2010 | Chen et al. | 700/101 |
| 7,720,557 B2 * | 5/2010 | Teferra et al. | 700/112 |
| 7,720,631 B2 * | 5/2010 | Pike | 702/152 |
| 7,925,378 B2 * | 4/2011 | Gilchrist et al. | 700/218 |
| 7,974,726 B2 * | 7/2011 | Rothe et al. | 700/112 |
| 2002/0138172 A1 * | 9/2002 | Bahri et al. | 700/217 |
| 2002/0161618 A1 * | 10/2002 | Weiss et al. | 705/8 |
| 2003/0214911 A1 * | 11/2003 | Fukunari | 370/238 |
| 2004/0096586 A1 * | 5/2004 | Schulberg et al. | 427/372.2 |
| 2004/0230341 A1 * | 11/2004 | Suh et al. | 700/264 |
| 2005/0137751 A1 * | 6/2005 | Cox et al. | 700/245 |
| 2005/0209721 A1 * | 9/2005 | Teferra et al. | 700/100 |
| 2005/0228542 A1 * | 10/2005 | Stone et al. | 700/245 |
| 2006/0020367 A1 * | 1/2006 | Nangoy | 700/245 |
| 2007/0071581 A1 * | 3/2007 | Gilchrist et al. | 414/217 |
| 2007/0276531 A1 * | 11/2007 | Teferra et al. | 700/112 |
| 2008/0101912 A1 * | 5/2008 | Martin et al. | 414/935 |
| 2008/0118338 A1 * | 5/2008 | Huang et al. | 414/744.3 |
| 2008/0125900 A1 * | 5/2008 | Maxim et al. | 700/113 |
| 2008/0188983 A1 * | 8/2008 | Ban et al. | 700/245 |
| 2008/0232948 A1 * | 9/2008 | van der Meulen et al. | 414/805 |
| 2008/0255798 A1 * | 10/2008 | Buzan | 702/150 |
| 2008/0260499 A1 * | 10/2008 | van der Meulen | 414/217 |
| 2008/0282710 A1 * | 11/2008 | Bartlett et al. | 62/55.5 |
| 2009/0050270 A1 * | 2/2009 | Bagley et al. | 156/345.24 |
| 2009/0093906 A1 * | 4/2009 | Takizawa et al. | 700/214 |
| 2009/0198377 A1 * | 8/2009 | Adachi et al. | 700/250 |
| 2009/0208313 A1 * | 8/2009 | Hayashi et al. | 414/222.02 |
| 2009/0276082 A1 * | 11/2009 | Murata | 700/226 |
| 2010/0094452 A1 * | 4/2010 | Ogi | 700/228 |
| 2010/0278622 A1 * | 11/2010 | Huang et al. | 414/673 |

FOREIGN PATENT DOCUMENTS

| | | |
|---|---|---|
| KR | 10-2004-0104421 | 12/2004 |
| KR | 10-0772843 | 11/2007 |

* cited by examiner

Nominal Sensor Locations

| | STATION | SENSOR | R (in) | T (deg) |
|---|---|---|---|---|
| 1 | 6 (AL1) | 1 | 18.53712 | 19.9025 |
| 2 | 6 (AL1) | 2 | 18.42044 | 37.8001 |
| 3 | 6 (AL1) | 3 | 18.85802 | 44.5889 |
| 4 | 1 (PM1) | 1 | 18.53712 | 79.9025 |
| 5 | 1 (PM1) | 2 | 18.42044 | 97.8002 |
| 6 | 1 (PM1) | 3 | 18.85802 | 104.5889 |
| 7 | 2 (PM2) | 1 | 18.53712 | 139.9025 |
| 8 | 2 (PM2) | 2 | 18.42044 | 157.8002 |
| 9 | 2 (PM2) | 3 | 18.85802 | 164.5889 |
| 10 | 3 (PM3) | 1 | 18.53712 | 199.9025 |
| 11 | 3 (PM3) | 2 | 18.42044 | 217.8002 |
| 12 | 3 (PM3) | 3 | 18.85802 | 224.5889 |
| 13 | 4 (PM4) | 1 | 18.53712 | 259.9025 |
| 14 | 4 (PM4) | 2 | 18.42044 | 277.8002 |
| 15 | 4 (PM4) | 3 | 18.85802 | 284.5889 |
| 16 | 5 (AL2) | 1 | 18.53712 | 319.9025 |
| 17 | 5 (AL2) | 2 | 18.42044 | 337.8002 |
| 18 | 5 (AL2) | 3 | 18.85802 | 344.5889 |

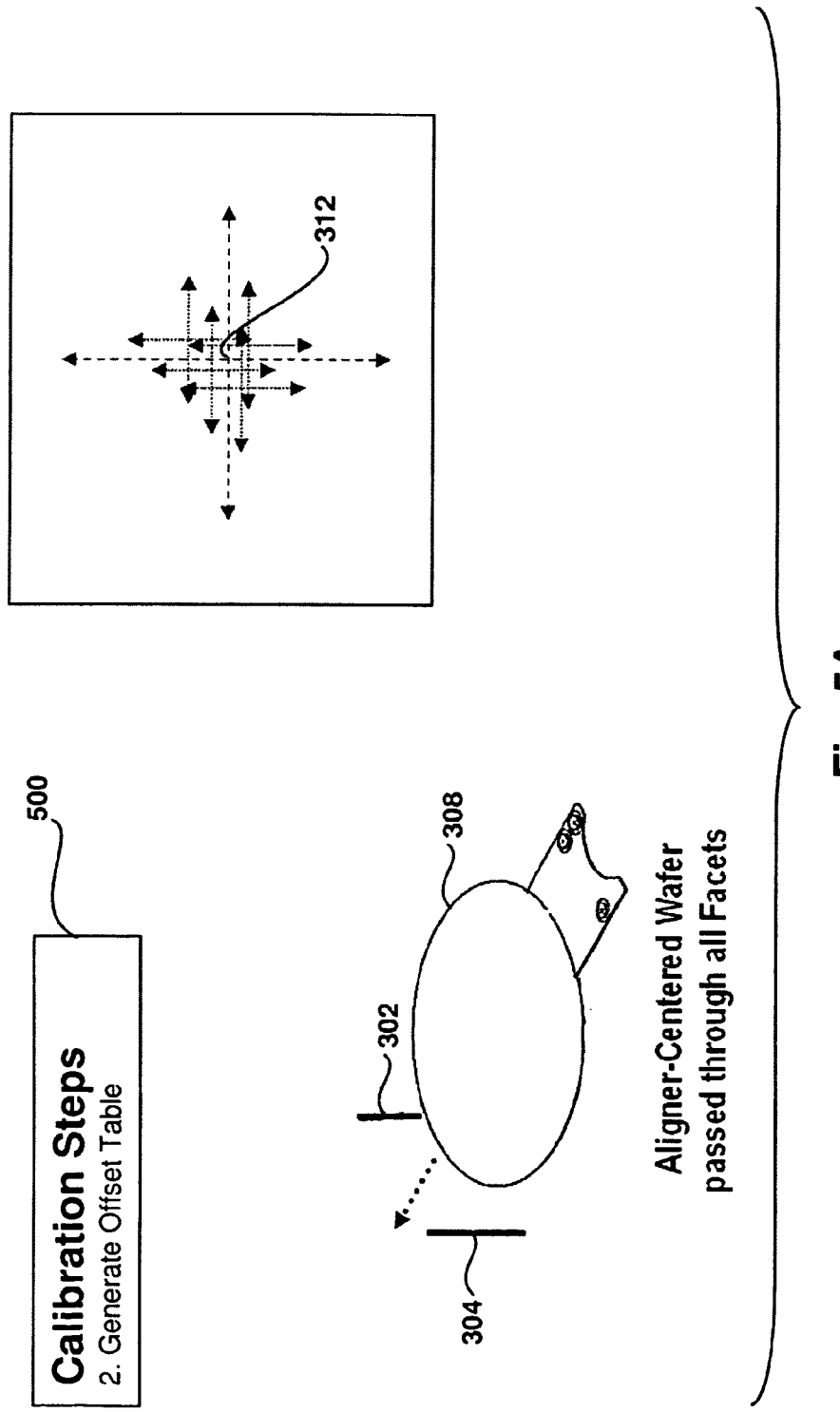

DYNAMIC ALIGNMENT OF WAFERS USING COMPENSATION VALUES OBTAINED THROUGH A SERIES OF WAFER MOVEMENTS

BACKGROUND

1. Field of the Invention

The present invention relates to transferring wafers among modules of semiconductor processing equipment, and more particularly to placing accurately each wafer, with the support blade that carries the wafer, inside the modules.

2. Description of the Related Art

In the manufacture of semiconductor devices, process chambers are interfaced to permit transfer of wafers or substrates, for example, between the interfaced chambers. Such transfer is via transfer modules that move the wafers, for example, through slots or ports that are provided in the adjacent walls of the interfaced chambers. Transfer modules are generally used in conjunction with a variety of wafer processing modules (PM), which may include semiconductor etching systems, material deposition systems, and flat panel display etching systems.

A vacuum transfer module (VTM) may be physically located between one or more clean room storage facilities where wafers are stored, and multiple wafer processing modules where the wafers are actually processed, e.g., etched or have deposition performed thereon. In this manner, when a wafer is required for processing, a robot arm located within the transfer module may be employed to retrieve a selected wafer from storage and place the wafer into one of the multiple processing modules.

Sensors at each of the facets of each station have been used to increase the accuracy of wafer placement inside each station. However, the accuracy for placing wafers suffers due to multiple factors. For example, the position of the sensors may not be perfect and small deviations in sensor location result in defects when calculating wafer position. In addition, the robot transporting the wafer may not be in the exact place where the system believes that the robot is, which creates another source for errors. Still yet, the robots that transfer the wafers often have two arms to increase speed and flexibility in the system. In practice, there are operational differences between using one robot arm or the other, producing different results according to which robot arm picks up, or places the wafer when transporting the wafer. Additionally, existing methods are susceptible to operator's errors and are not automated, requiring long calibration times.

It is in this context that embodiments of the invention arise.

SUMMARY

Embodiments of the present invention provide methods and systems to optimize wafer placement repeatability in semiconductor manufacturing equipment using a controlled series of wafer movements. In one embodiment, a preliminary station calibration is performed to teach a robot position for each station interfaced to facets of a vacuum transfer module used in semiconductor manufacturing. The method also calibrates the system to obtain compensation parameters that take into account the station where the wafer is to be placed, the position of sensors in each facet, and the offsets derived from performing extend and retract operations of a robot arm. In another embodiment where the robot includes two arms, the method calibrates the system to compensate for differences derived from using one arm or the other. During manufacturing, the wafers are placed in the different stations using the compensation parameters It should be appreciated that the present invention can be implemented in numerous ways, such as a process, an apparatus, a system, a device or a method on a computer readable medium. Several inventive embodiments of the present invention are described below.

In one embodiment, a method to optimize wafer placement repeatability in semiconductor manufacturing equipment using a controlled series of wafer movements. The method performs a preliminary station calibration to teach a robot position for each station interfaced to facets of a vacuum transfer module used in semiconductor manufacturing, followed by a calibration of the system. During manufacturing, the wafers are placed in the different stations using compensation values obtained during the calibration. The calibration includes the following operations:

1. accessing a table having nominal sensor locations for each facet. Typically, the actual sensors locations deviate slightly from the locations where the system believes that the sensors are.

2. identifying one of the stations as a reference station, identifying reference transfer direction (extend vs. retract), and identifying reference robot arm (in the case that robot has multiple arms).

3. picking at the reference station a wafer that is known to be properly positioned, using for example an aligner. This position is established as centered relative to the robot.

4. passing the picked wafer through the plurality of facets and measuring extend and retract offsets when the robot passes the wafer into and out of the stations with each arm.

5. creating an offset table to compensate for repeatable measurement error induced by differences between extend and retract direction, as well as error induced by using nominal sensor locations, (for each arm). The offset table enables the system to determine actual wafer location relative to the robot, which can be used as a compensation offset to optimize wafer placement location.

6. adjusting robot values for each station to ensure that the wafer is placed in the desired location by the reference arm. This can be done by picking and measuring a wafer centered relative to the station by an aligner or fixture.

7. refining the station locations using metrology based alignment to ensure that the wafer is placed in the desired location by the reference arm.

8. fine tune offset table values and robot position for each station by obtaining data from repeatedly placing and picking of the wafer. By using multiple measures and generating a representative value, the system is able to obtain more accurate fine tuning values.

Other aspects of the invention will become apparent from the following detailed description, taken in conjunction with the accompanying drawings, illustrating by way of example the principles of the invention.

BRIEF DESCRIPTION OF THE DRAWINGS

The invention may best be understood by reference to the following description taken in conjunction with the accompanying drawings in which:

FIG. 4 shows a sample nominal sensor location table according to one embodiment.

FIGS. 5A-5B describe the generation of the offset table in one embodiment of the invention.

DETAILED DESCRIPTION

Methods and systems to optimize wafer placement repeatability in semiconductor manufacturing equipment using a controlled series of wafer movements are provided. In one embodiment, a preliminary station calibration is performed to teach a robot position for each station interfaced to facets of a vacuum transfer module (VTM) used in semiconductor manufacturing. The method also calibrates the system to obtain compensation parameters that take into account the station where the wafer is to be placed, position of sensors in each facet, and offsets derived from performing extend and retract operations of a robot arm. A well aligned wafer is used to fine tune the positioning of the wafer in each station and to help compensate for small deviations of the sensor locations from the desired location.

In another embodiment where the robot includes two arms, the method calibrates the system to compensate for differences resulting from using one arm or the other. During manufacturing, the wafers are placed in the different stations using the compensation parameters. Additionally, the compensation values are used to measure the wafer position when picking the wafer from a station to calculate where wafer center is relative to station center.

It will be obvious, however, to one skilled in the art, that the present invention may be practiced without some or all of these specific details. In other instances, well known process operations have not been described in detail in order not to unnecessarily obscure the present invention.

Figure 1:
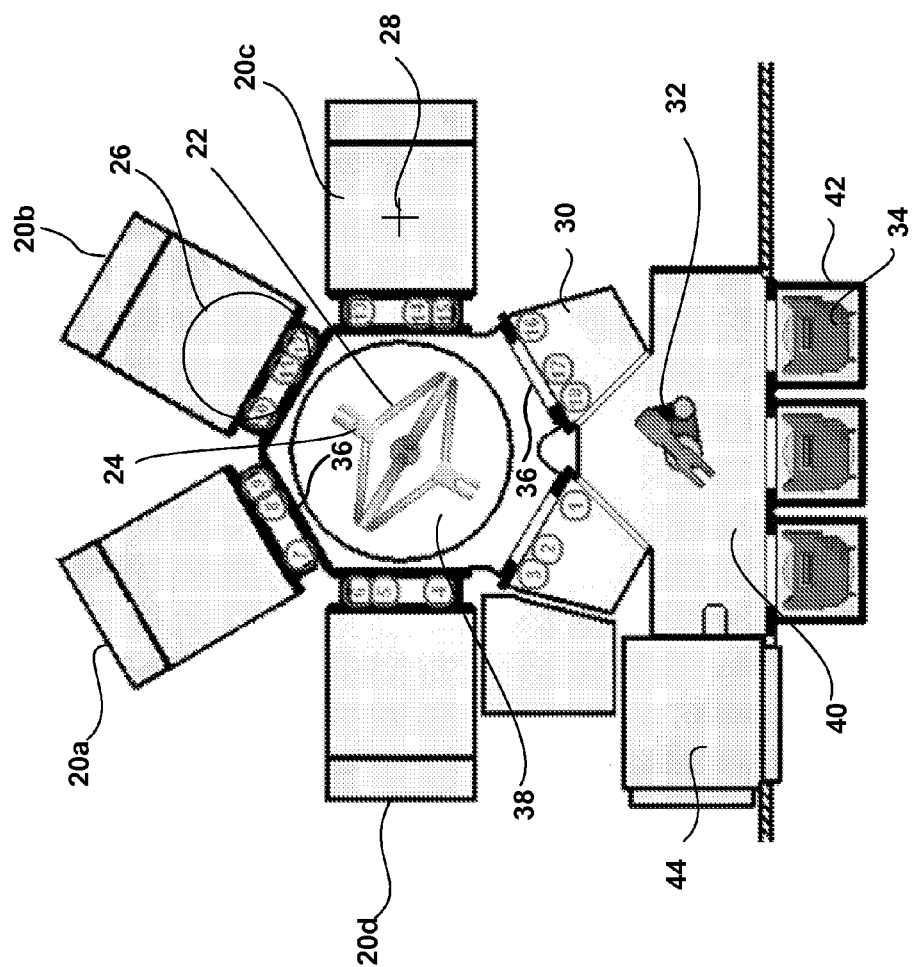
FIG. 1 depicts a typical semiconductor process cluster architecture illustrating the various modules that interface with a vacuum transfer module (VTM).

FIG. 1 depicts a typical semiconductor process cluster architecture illustrating the various modules that interface with a vacuum transfer module 38 (VTM). As is well known to those skilled in the art, the arrangement of transfer modules to "transfer" wafers among multiple storage facilities and processing modules is frequently referred to as a "cluster tool architecture" system. Airlock 30, also called a loadlock or a transfer module, is shown in VTM 38 with four processing modules 20a-20d which may be individually optimized to perform various fabrication processes. By way of example, processing modules 20a-20d may be implemented to perform transformer coupled plasma (TCP) substrate etching, layer depositions, and/or sputtering. When speaking in general about airlock 30 or process module 20, the term station will be used at times to refer to either an airlock or a process module. Each station has a facet 36 that interfaces the station to vacuum transfer module 38. In Inside each facet, sensors 1-18 are used to detect the passing of wafer 26 when going in and out of the respective stations.

Robot 22 transfers wafer 26 between stations. In one embodiment, robot 22 has one arm, and in another embodiment robot 22 has two arms, where each arm has and end-effector 24 to pick the wafers for transport. Front-end robot 32, in atmospheric transfer module 40 (ATM), is used to transfer wafers from cassette, or Front Opening Unified Pod (FOUP) 34 in Load Port Module (LPM) 42 to airlock 30. Module center 28 inside process module 20 indicates the ideal placement for placing wafer 26. Aligner 44 in ATM 40 is used to align wafers.

When transferring the wafer from airlock 30 inside the vacuum transfer module 38, the center of the wafer may not be accurately positioned relative to the station. As a result, when the blade of robot 22 in VTM 38 picks the wafer, the center of the wafer may not be properly located, or aligned, relative to the center of the blade. This improper wafer center to blade center alignment, also referred to as "wafer-blade misalignment" or simply "wafer misalignment," continues as the robot performs an "extend" operation, by which the blade (and the wafer carried by the blade) are moved through a slot in the processing module and by which the wafer is placed on pins in the processing module 20a, for example.

This wafer misalignment may continue as the robot performs a "retract" operation, by which the blade (and the wafer carried by the blade) are moved through the slot in the processing module 20c. Such wafer misalignment may also continue during a subsequent extend operation by which the wafer is placed in another one of the processing modules, such as PM 20b.

It should be noted that the computer controlling the wafer movement can be local to the cluster architecture, or can be located somewhere in the manufacturing floor, or in a remote location, and connected to the cluster architecture via a network.

In previous U.S. Pat. No. 6,502,054 issued Dec. 31, 2002 and titled "Method of and apparatus for dynamic alignment of substrates" assigned to the same assignee as the current invention, which is herein incorporated by reference, a method, called Dynamic Alignment (DA), was provided for using sensors in the different facets to improve wafer placement. However, while dynamic alignment improves the accuracy for placing wafers, other factors in the system introduce errors in the placement of wafers, even using sensors. For example, the position of the sensors may not be perfect and small deviations in sensor location result in defects in calculating wafer position. In addition, the robot transporting the wafer may not be in the exact place where the system believes that the robot is creating another source of errors. Still yet, the robots that transfer the wafers often have two arms to increase speed and flexibility in the system. There are operational differences between using one robot arm or the other, resulting in different results according to which robot arm picks up, or places the wafer when transferring the wafer.

Additionally, there is a need to create a method that automates the calibration process to improve repeatability of the alignment with reduced dependence on engineer's time. Moreover, there is a need to increase the consistency of the Dynamic Alignment independent of wafer flow and station.

Embodiments of the present invention improve the use of dynamic alignment in a manufacturing environment for better wafer placement. The embodiments presented here have been named Dynamic Alignment III.

Figure 2:
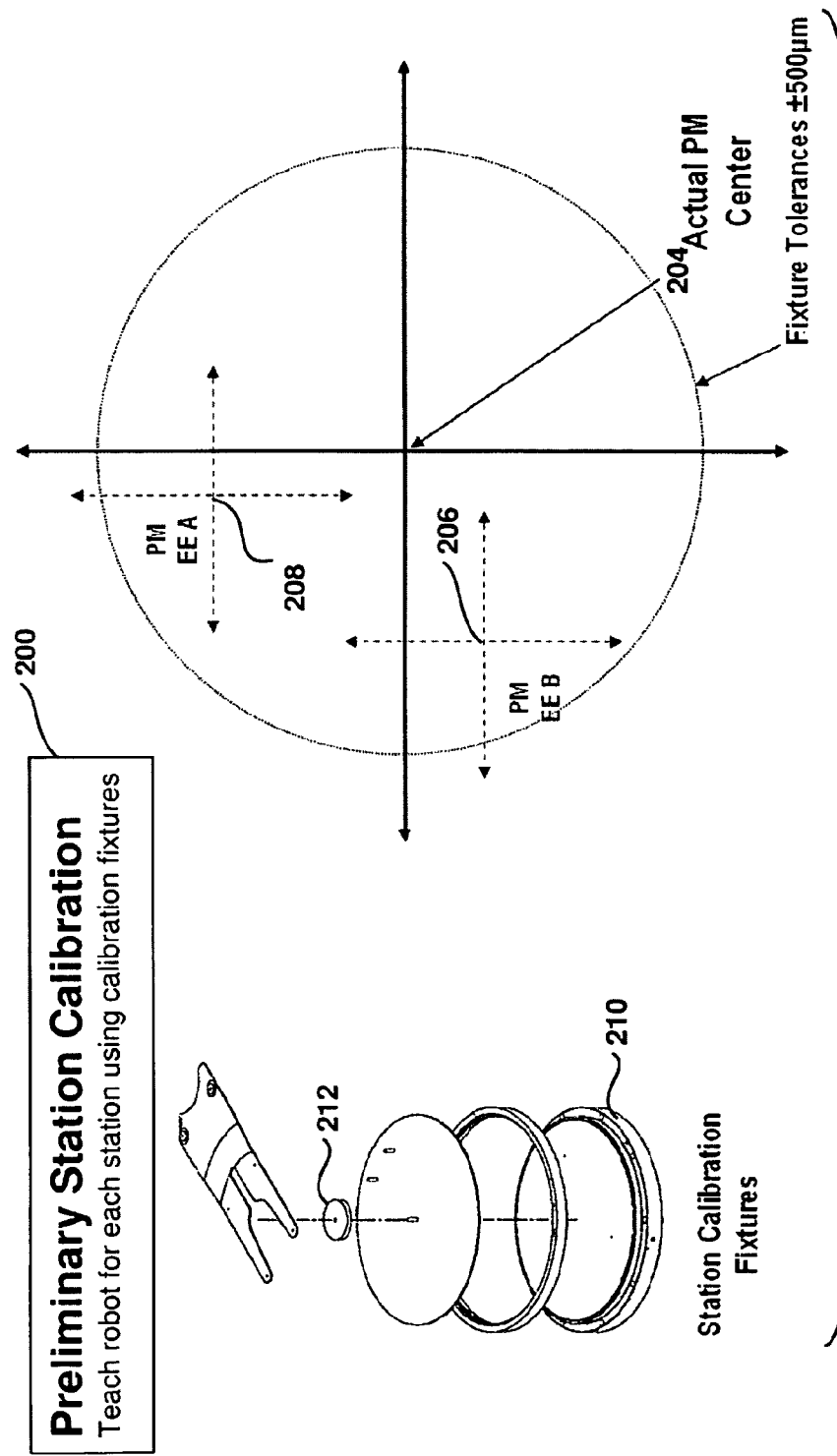
FIG. 2 shows a preliminary station calibration process.

FIG. 2 shows a preliminary station calibration process. This operation teaches robot values for each station. After a preliminary station calibration, if a wafer centered on the robot arm is placed in the station without DA, the wafer inside calibration fixture 210 would land in position 208 within calibration fixture's 210 tolerance from station center 204. If the same is done with the other arm, the wafer would land in position 206 in a different location, within calibration fixture's 210 tolerance from station center 204.

In one embodiment, the preliminary station calibration process is repeated several times until the fixture is properly positioned inside the station within the tolerances required. A sample value for fixture tolerance is 500 μm.

Figure 3:
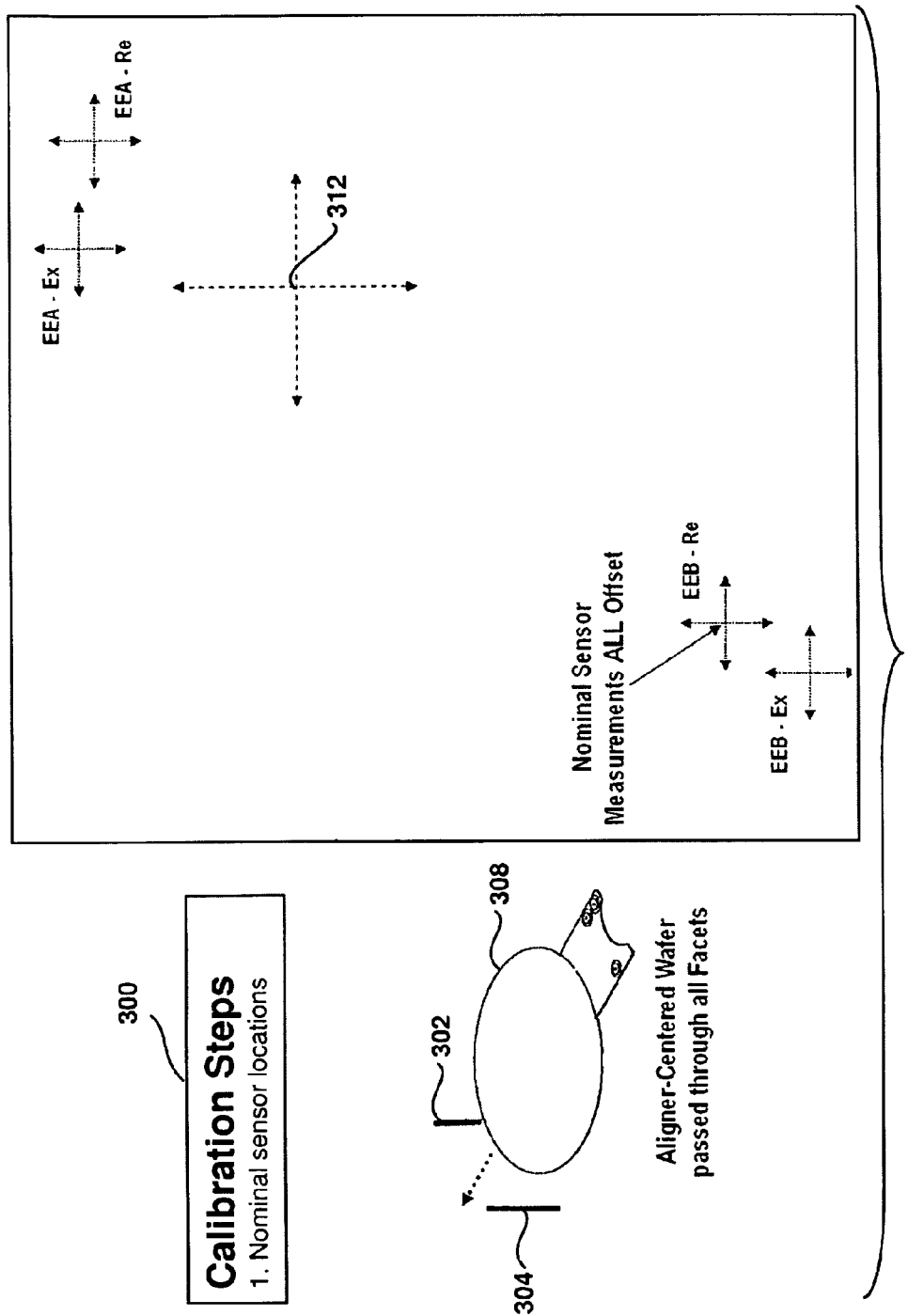
FIG. 3 describes one embodiment that uses nominal sensor locations during the calibration process.

FIG. 3 describes one embodiment that uses nominal sensor locations during the calibration process. This is the first operation 300 in the calibration operation for the Dynamic Alignment III method. A table of nominal sensor locations indicates the estimated positions of sensors in each facet. The wafer is centered in the reference station with an aligner or another repeatable mechanism. The person skilled in the art will appreciate that when the term 'centered wafer' is used, it means 'properly positioned wafer.' In general, the system is designed to use 'properly positioned' or 'optimally positioned,' even though in this case 'centered' on a round electrode actually is preferred and is well defined. In another embodiment, placement can be off axis, or alignment can be performed without respect to a feature with an axis of symmetry.

FIG. 4 shows a sample nominal sensor location table 402 according to one embodiment. The table shows six different stations, including four processing modules and two airlocks. Each station has three sensors, 1-3, associated with the station, and for each sensor there are two measurements to indicate the location with reference to a point in the cluster tool architecture. In one embodiment, the reference point is the robot home position. The two measurements are a Radius in inches R, and an angle T.

FIG. 5A describes the generation of the offset table in one embodiment of the invention. Centered wafer 308 is picked from the reference station and is considered centered relative to the robot arm. The wafer is brought to the preliminary robot position 312, through sensors 302 and 304, and Dynamic Alignment is used to measure the offset of the wafer, based on the nominal place of the sensor and the measurements when the wafer goes in (extend) and out (retract). In one embodiment, extend and retract measurements for two robot arms originate 4 measurements per station, EEA-Ex, EEA-Re, EEB-Ex, and EEB-Re.

In one embodiment, the extend and retract operations are repeated multiple times, such as 10 to 20 times in a row, and then the measurements are averaged to get a representative value. This reduces the effect of robot repeatability on the measurements. In another embodiment, the operation to change arms is done at the reference station dropping the wafer only once and at a reduced speed to reduce the effect of wafer shifting during picks and places.

The offset table consists of the Dynamic Alignment measured offset of a centered wafer when passed to and from the robot station location, for each combination of arm, station, and direction. The offset table will be used to determine where a wafer is relative to the robot, but it is still unknown exactly where the robot arm is relative to the station, within tolerances from the preliminary station calibration. The offsets tabulated in the offset table reflect the unknown, but consistent deviations in Dynamic Alignment measurement resulting from deviations in sensor location with respect to their nominal position, differences between extend and retract motions, differences between robot arms (if applicable), and other tolerance and uncertainty stack-ups for each facet-blade-direction combination. The generation of the offset table is used to determine these unknown offsets for a centered wafer and to link the calibration for all facets, blades, and directions in an Offset Table so that Dynamic Alignment III measurements will be consistent, that is, independent of the facet-blade-direction measurement.

Figure 5B:
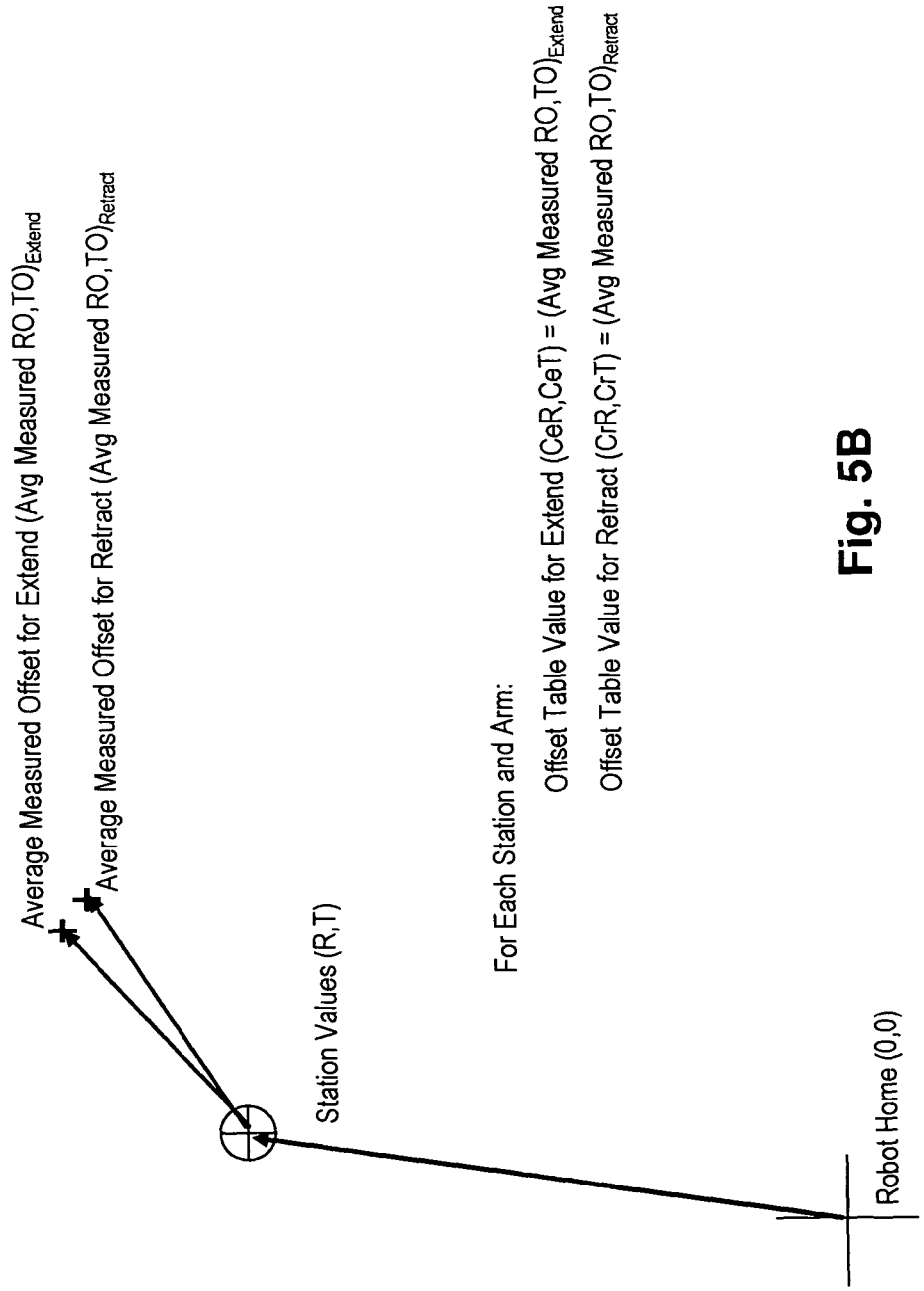

The measured offsets are used by the software during the manufacturing process to compensate wafer placement during wafer centering operations. The following is a detailed description of the operations performed to calculate the offset table values according to one embodiment of the invention:

1. Pick the wafer from reference station with reference blade.
2. Extend and retract through reference facet and all the facets in the VTM, toward robot station locations multiple times. The default value is 20 times, but other values are also possible. Measure extend and retract offsets during each pass.
3. Reduce robot Z-velocity.
4. Place wafer back in reference station and pick the wafer with the non-reference blade.
5. Return to original robot Z-velocity.
6. Pass the wafer through each facet with the non-reference blade multiple times. Measure extend and retract offsets during each pass.
7. For each station, determine the station offsets by calculating the average offset values for each combination of arm, station, and direction. FIG. 5B shows graphically the determination of the station offsets for one embodiment of the invention. For each station and arm, the following values are calculated:

Offset Table Value for Extend$(CeR,CeT)$=(Avg Measured $RO,TO)_{Extend}$

Offset Table Value for Retract$(CrR,CrT)$=(Avg Measured $RO,TO)_{Retract}$

Figure 6:
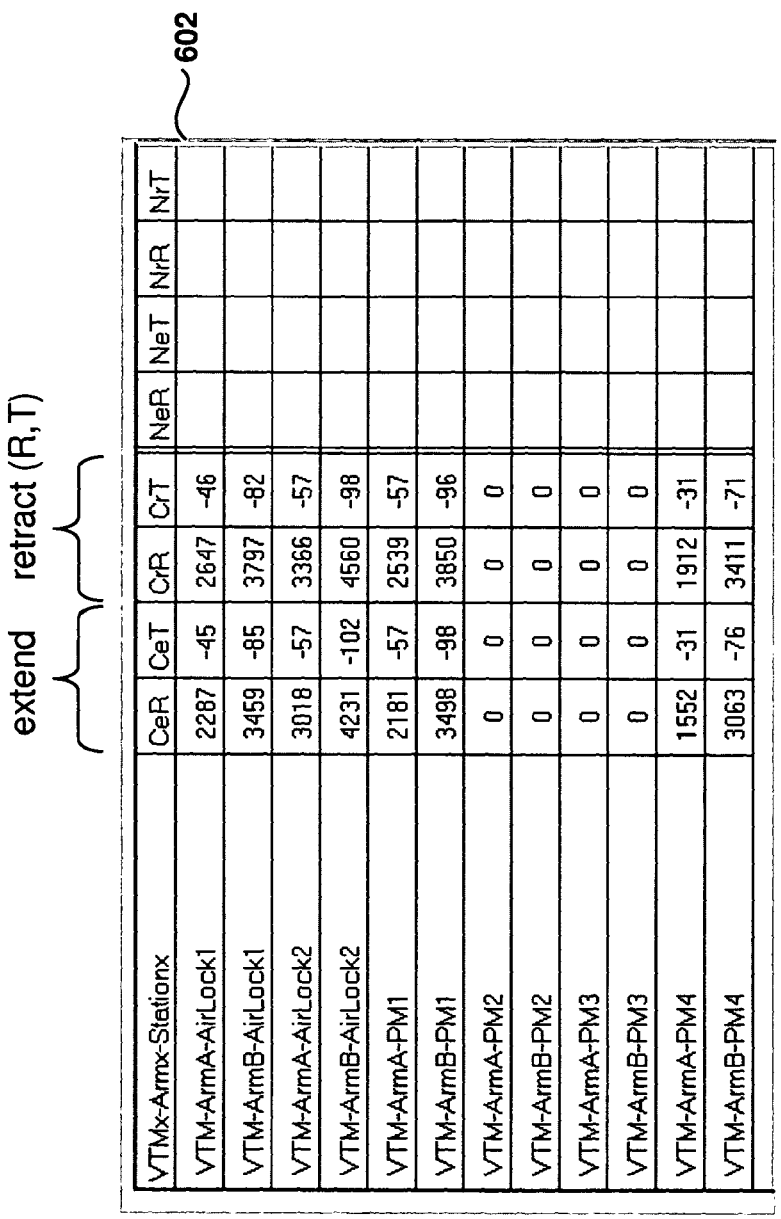
FIG. 6 shows a sample offset table.

FIG. 6 shows a sample offset table 602, which is populated with the average offset values for each combination of arm, station, and direction. The leftmost column holds the name of the combination blade-station. The next two columns show the extend values, and the following two columns the retract values. The person skilled in the art will appreciate that other tables can be used to hold the offset values as long as the principles of the invention described herein are maintained.

Figure 7A:
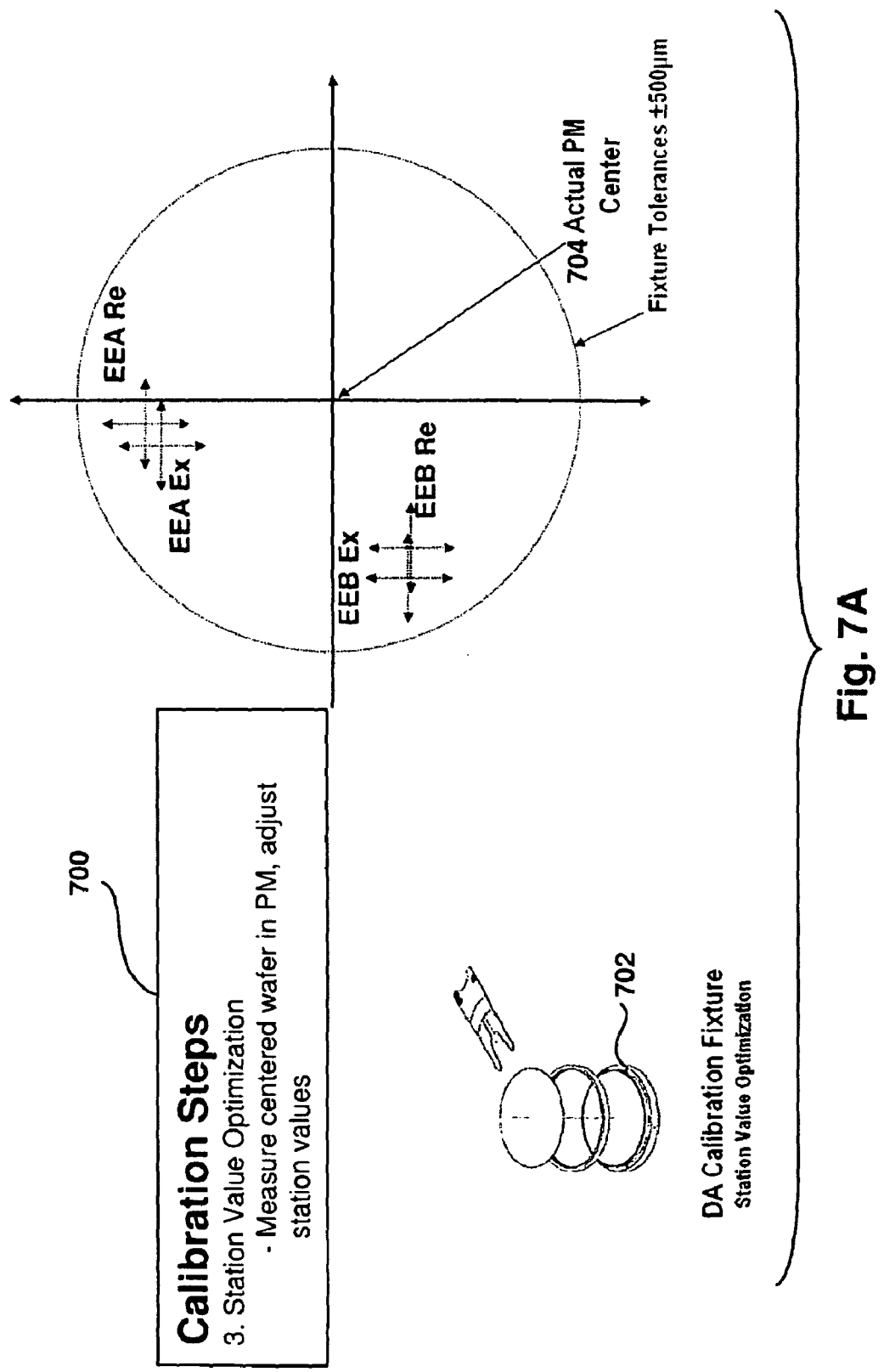
FIGS. 7A-7B depict the station value optimization operation in one embodiment.

FIG. 7A depicts the station value optimization operation in one embodiment. This operation is used to teach station center. The reference arm values need to be adjusted so that the reference arm places the wafer in the station center, allowing the alignment of robot center and station center. The ideal station center is set for the PMs using centering jigs for mechanical alignment of wafer placement. The ideal robot station center is set for the Airlock by placing an aligned wafer in the station.

Figure 7B:
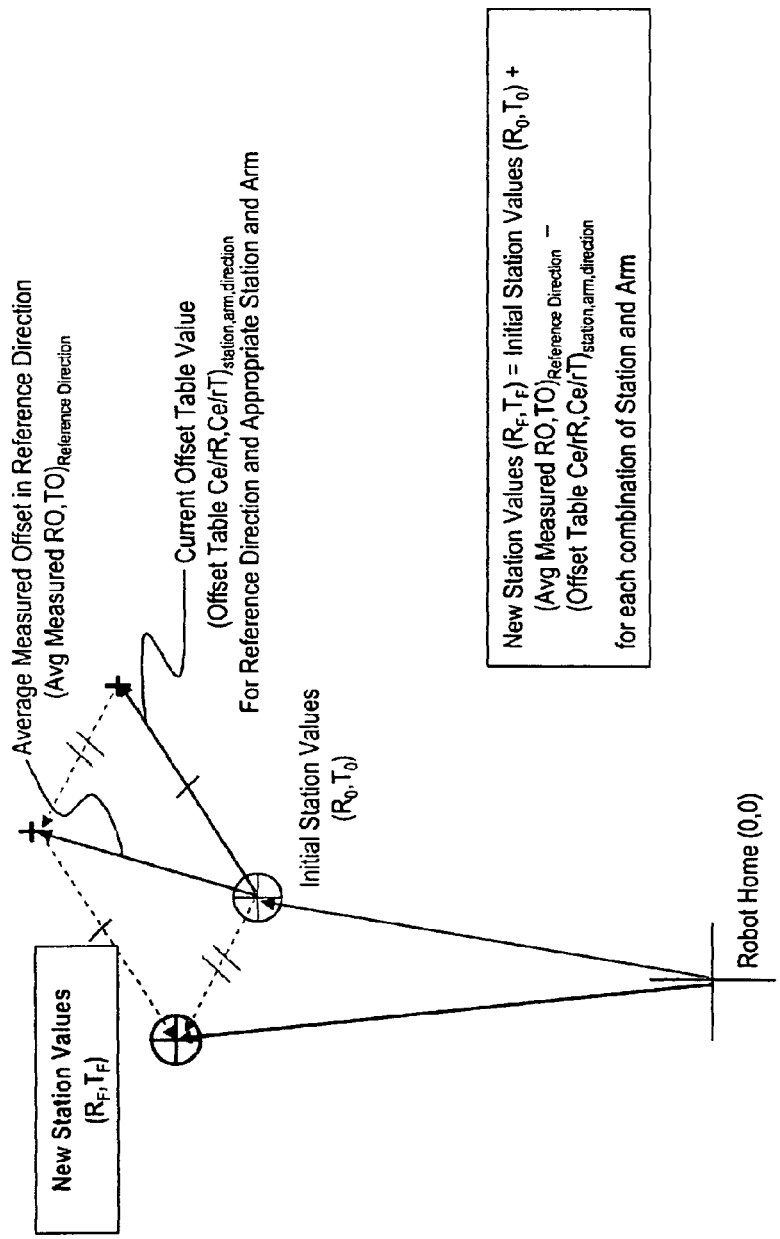

In one embodiment, the station values are adjusted for the reference blade by performing the following operations:

1. Reduce Z-Velocity.
2. Pick wafer out of station that can be a PM fixture or a slot of Airlock. The robot extends to preliminary station values $(R_O,T_O)$ to pick.
3. Pass wafer through facet multiple times and calculate the Average Measured Offset in the reference direction, (Avg Measured $R_O,T_O)_{Reference\ Direction}$. The default number of times is 20, but other values are also acceptable.
4. Place wafer back into fixture in PM or Airlock.
5. Calculate the new station values for the robot:

New Station Values$(R_F,T_F)$=Initial Station Values$(R_O, T_O)$+(Avg Measured $RO,TO)_{Reference\ Direction}$−(Offset Table $Ce/rR,Ce/rT)_{station,arm,direction}$ FIG. 7B shows graphically the different vectors used in the computation of the new station values for the robot. Repeat operations 1-5 until station value adjustments are very small, that is, under allowed tolerances. If after a configurable maximum number of repetitions the desired level of value adjustments has not been reached, then an error message is generated. Typical values for maximum number of repetitions range from 2 to 5, but other values are also possible.

The station values for the non-reference blade are adjusted next by picking the wafer with the non-reference blade and repeating the process previously performed with the reference blade. After completion, return robot to original Z-velocity.

Figure 8:
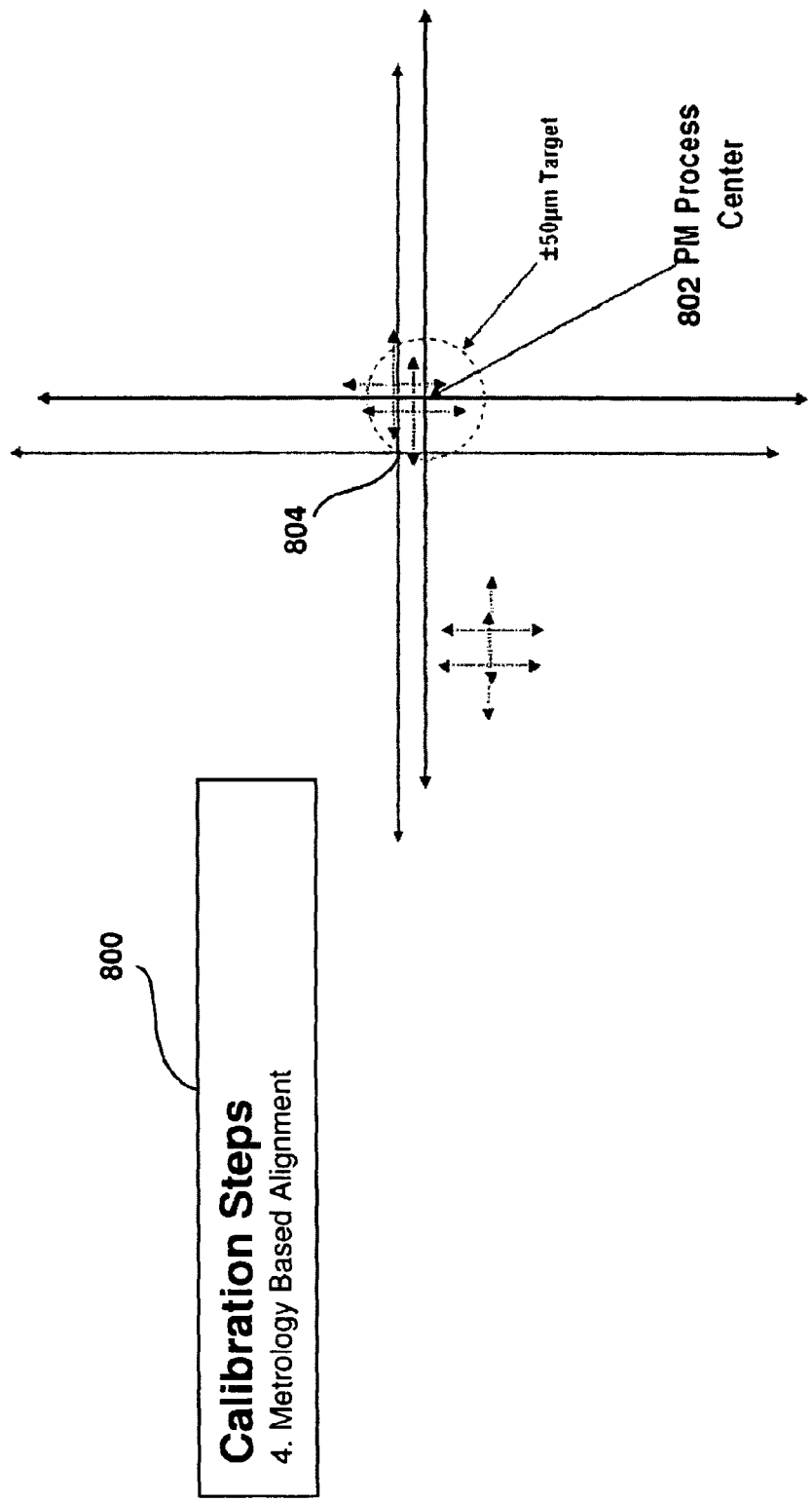
FIG. 8 shows using metrology based alignment during calibration according to one embodiment of the invention.

FIG. 8 shows using metrology based alignment during calibration according to one embodiment of the invention. This operation is also used to teach station center. In one embodiment, the final alignment of station position is fine tuned by interpreting etch rate results using Bevel Analysis Software (BAS). This technique for using an etched wafer to set up the wafer handling is called Metrology Based Alignment (MBA).

Figure 9A:
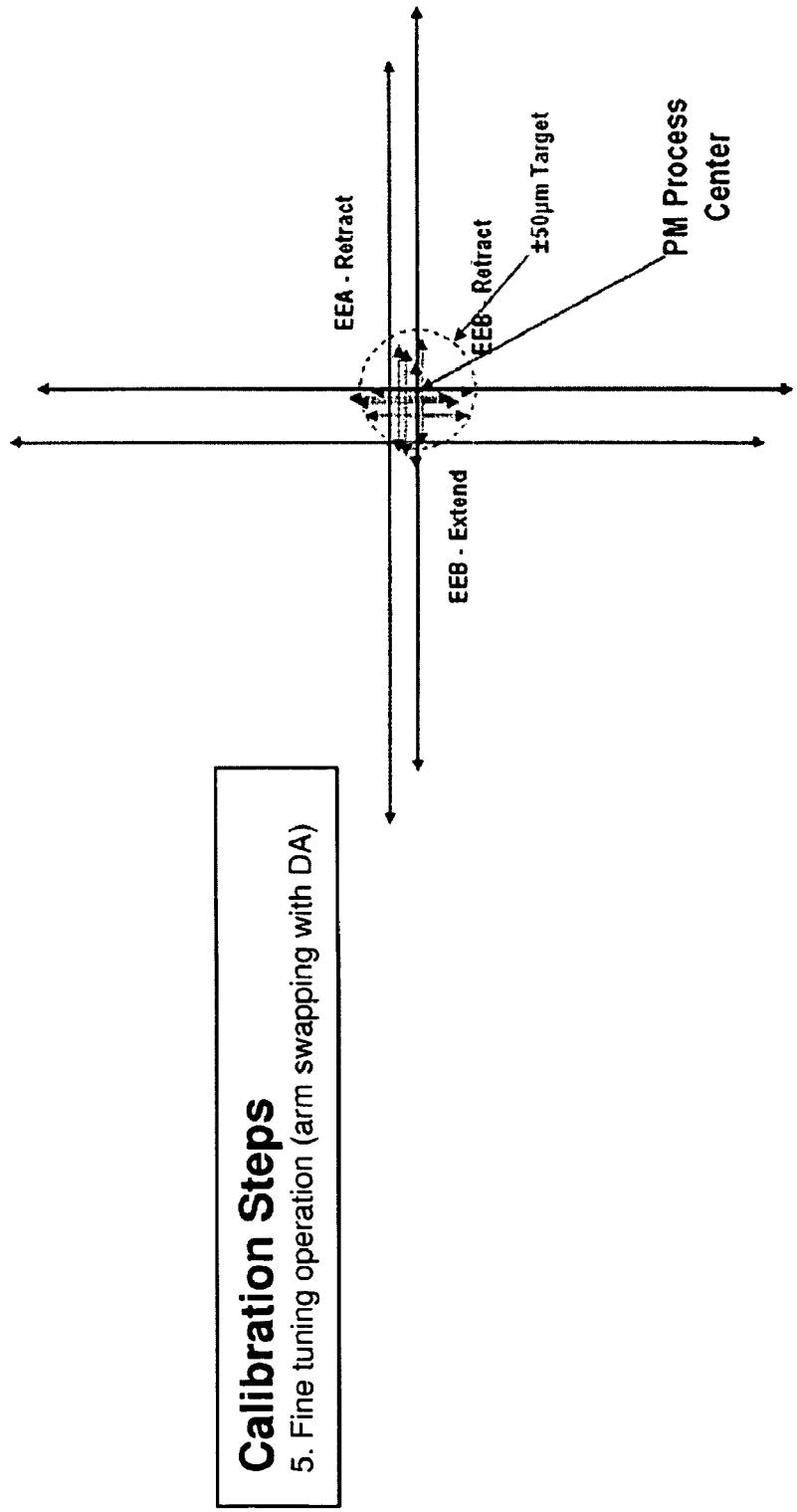
FIGS. 9A-9B depict a fine tuning operation during calibration in one embodiment.

FIG. 9A depicts a fine tuning operation during calibration in one embodiment. The wafer is placed in the PM with Dynamic Alignment III centering, and then the wafer is picked and the offset measured with the same or a different arm, using Dynamic Alignment III. One embodiment to implement the Dynamic Alignment III method is described below with respect to the description of FIG. 11C. There are two goals for performing this operation. The first goal is to determine where the non-reference arm places a centered wafer relative to where the reference arm places the centered wafer. The second goal is to measure where the wafer is during retract, after being centered. Each pick and place combo yields a cluster of values, and a representative value, also called "center," for the cluster is calculated to change the non-reference placement position, as well as the retract values in the offset table. This way, both arms will place the wafer in the same spot, and a centered wafer is measured as having no offset. It is already known that the reference arm uses the extend values to place the wafer in the correct location, and now the impact of dropping and picking is assessed, which causes the retract value to change from an ideal zero.

The small uncertainties and errors may result in discrepancies between the initial measurements, robot compensation, and reported offsets. The reported offsets are grouped in clusters, which are dependent on which blade is used to place/pick the wafer. It is possible to use the distribution of these clusters to fine tune calibrated values.

In one embodiment, the wafer is cycled through all the stations using extend correction and report on retract for all place/pick combinations, using Dynamic Alignment III. The following operations are performed for each station:

1. Cluster AA: Place with reference blade, and pick with reference blade.
2. Cluster AB: Place with reference blade, and pick with non-reference blade.
3. Cluster BB: Place with non-reference blade, and pick with non-reference blade.
4. Cluster BA: Place with non-reference blade, and pick with reference blade.
5. Repeat five to twenty times, or another value configured by the user, and calculate the average for each cluster, Cluster [Blade-Blade] $(RO,TO)_{Average}$.

Figure 9B:
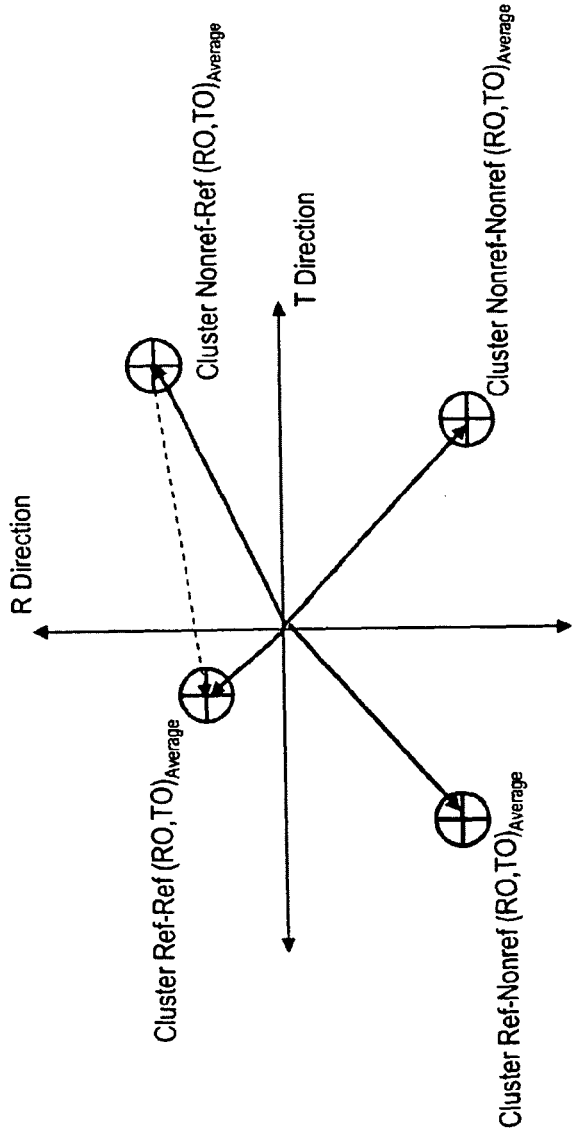

The following changes are applied to the offset table and robot station values after the fine tuning: See FIG. 9B for a vectorial representation of the calculations.

1. Calculate the new offset table retract values for reference blade:

New Offset Table Retract Values for Reference Blade, $(NrR,NrT)_{Ref\,Arm}$=Current Offset Table Retract Values$(CrR,CrT)_{Ref\,Arm}$+Cluster Ref-Ref$(RO,TO)_{Average}$.

2. Calculate the new station values for the non-reference blade:

New Station Values Nonref Arm$(R_F, T_F)_{Nonref\,Arm}$=Current Stn Values$(R_O, T_O)_{Nonref\,Arm}$-Cluster Nonref-Ref$(RO,TO)_{Average}$+Cluster Ref-Ref$(RO,TO)_{Average}$ 3. Calculate he offset table retract values for the non reference blade:

New Offset Table Retract Values for$(NrR,NrT)_{Nonref\,Arm}$=Current Offset Table Retract Values$(CrR,CrT)_{Nonref\,Arm}$+Cluster Nonref-Nonref$(RO,TO)_{Average}$ 4. Repeat 1-3 as needed for optimization.

Figure 10:
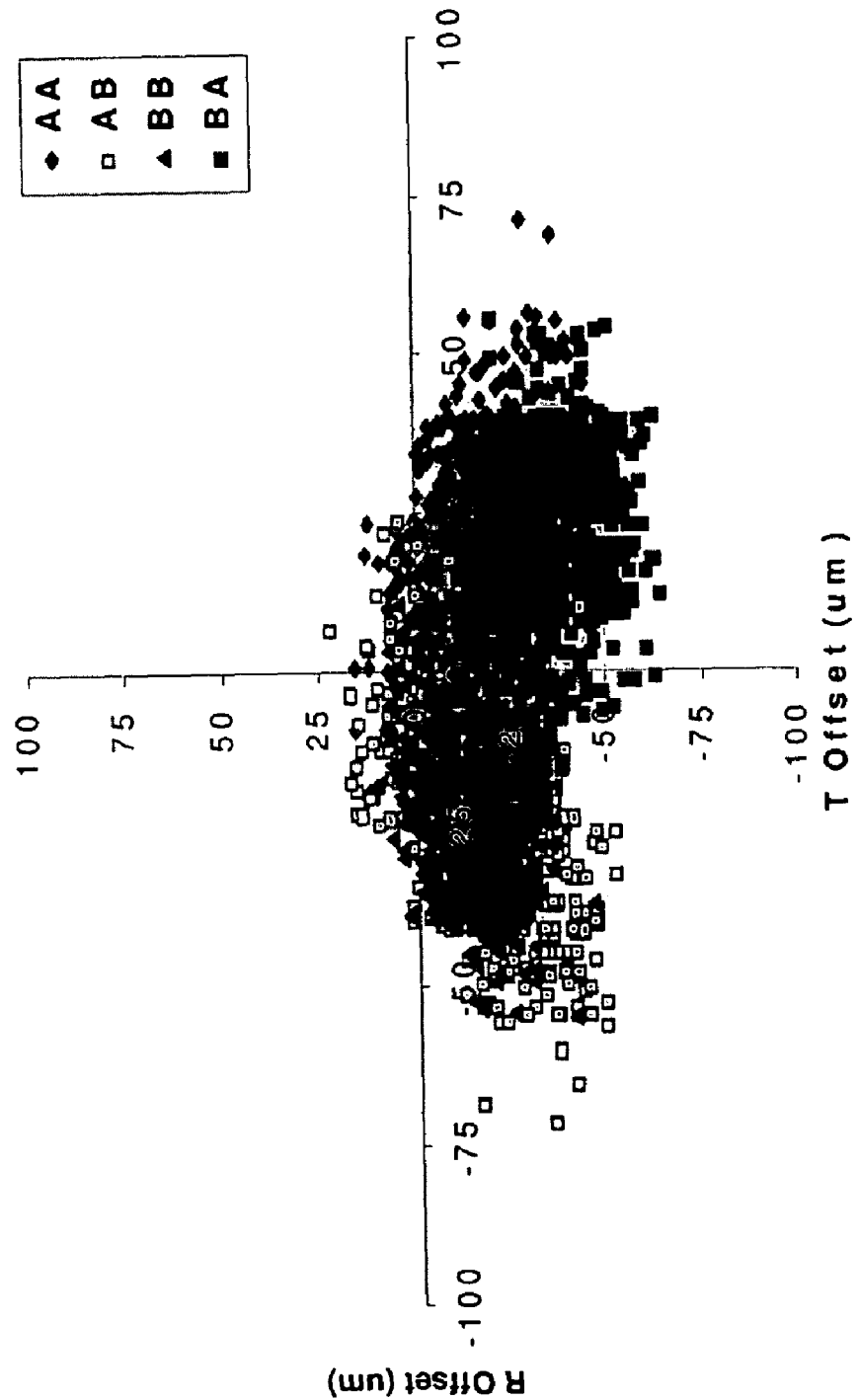
FIG. 10 shows a sample distribution of results for the fine tuning operation.

FIG. 10 shows a sample distribution of results for the fine tuning operation. The distribution of values for each cluster is displayed on two axis, an $R_{offset}$ axis and a $T_{offset}$ axis.

Figure 11A:
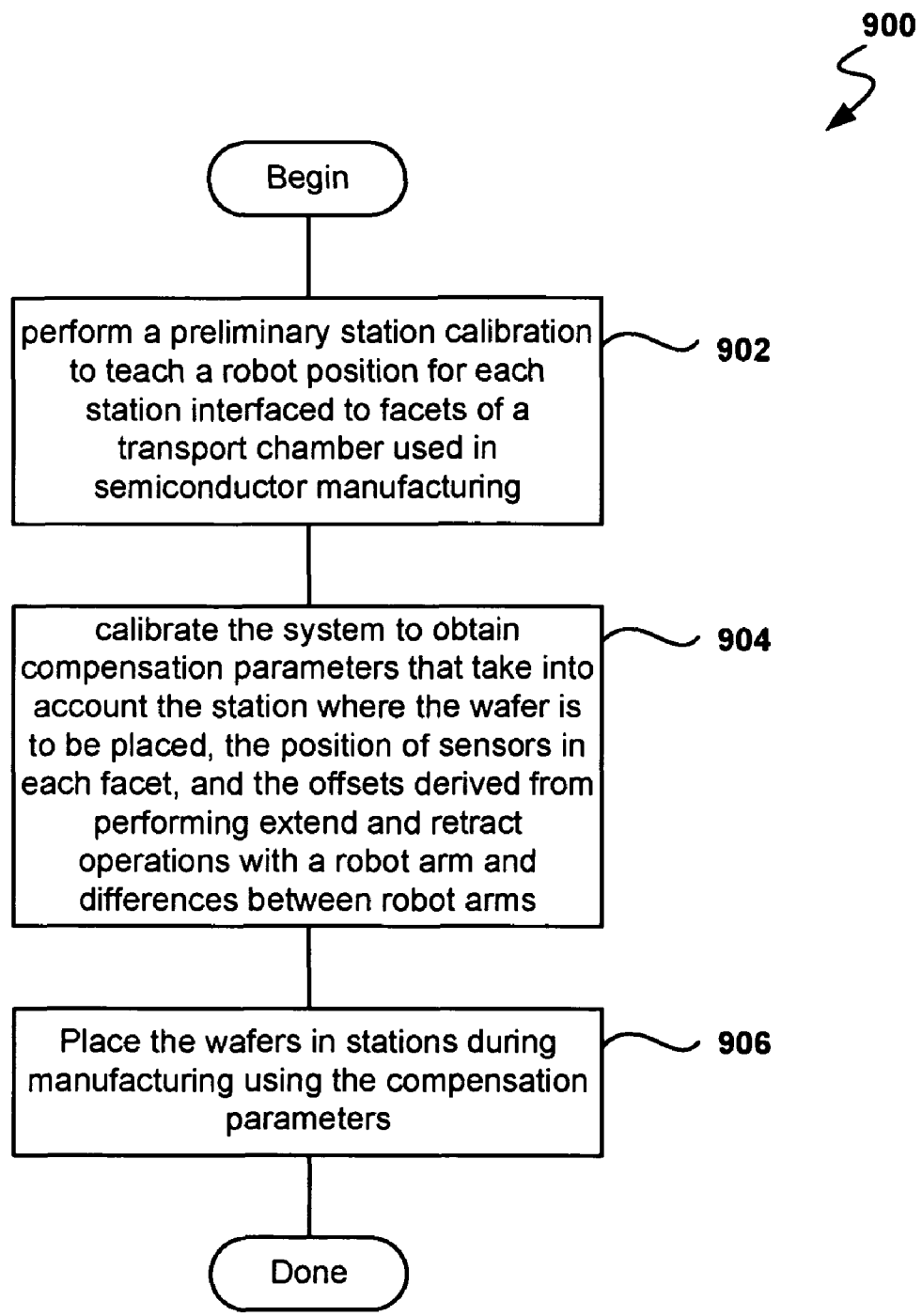
FIGS. 11A-11D show the process flows for obtaining the compensation values and using them during manufacturing.

FIGS. 11A-11D show the process flows for obtaining the compensation values and using them during manufacturing. FIG. 11A describes the process flow for optimizing wafer placement repeatability in semiconductor manufacturing equipment using a controlled series of wafer movements. In operation 902, the method performs a preliminary station calibration to teach a robot position for each station interfaced to facets of a VTM used in semiconductor manufacturing, as previously described with respect to FIG. 2. Then, in operation 904, the system is calibrated to obtain compensation parameters that take into account the station where the wafer is to be placed, position of sensors in each facet, and offsets derived from performing extend and retract operations of a robot arm and differences between robot arms. The results from operation 904 are used in operation 906 to place wafers in stations during manufacturing using the compensation parameters.

Figure 11B:
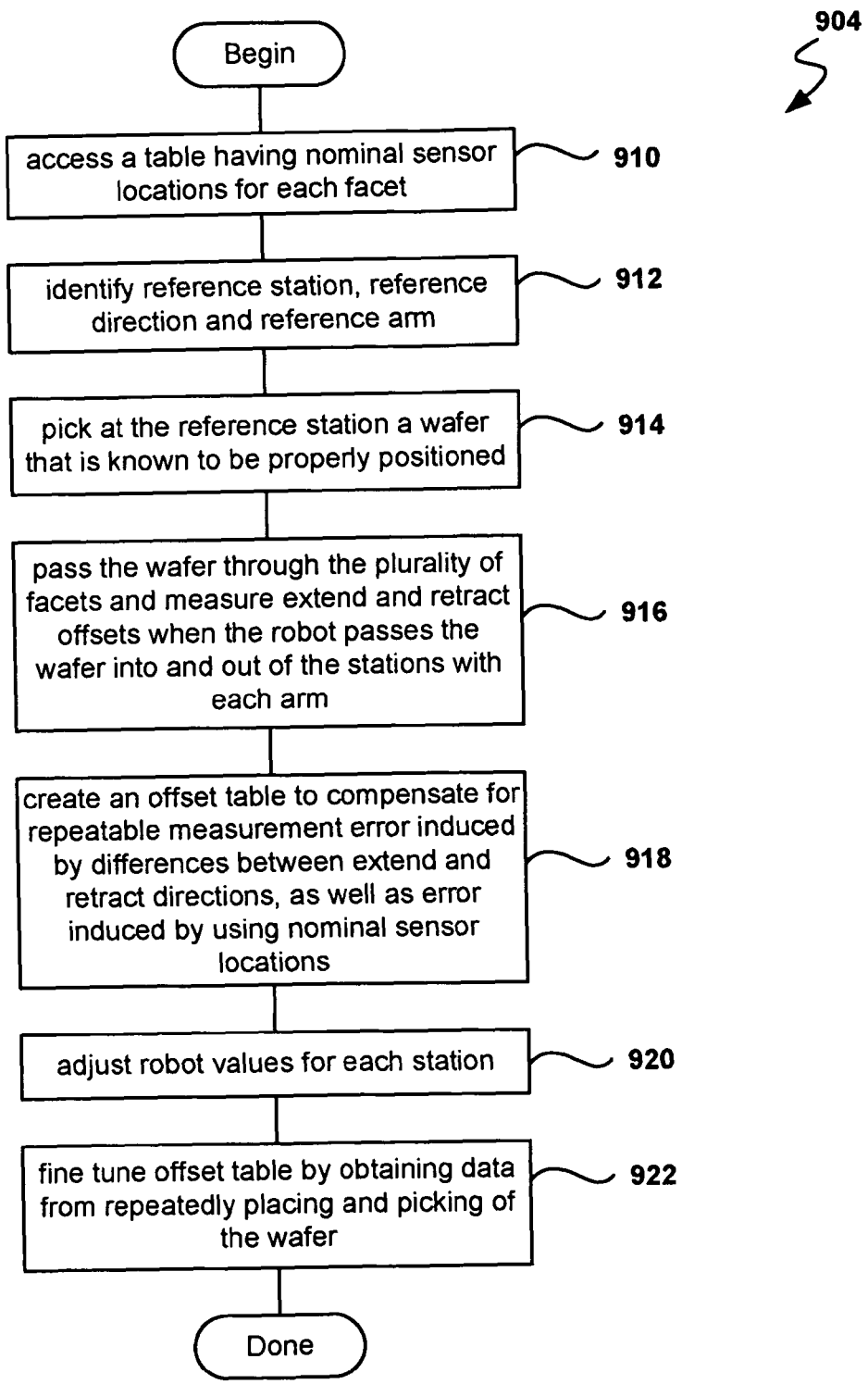

FIG. 11B describes in more detail operation 904 from FIG. 11A to calibrate the system. In operation 910, the method accesses a table having nominal sensor locations for each facet. Operation 912 follows where one of the stations is identified as a reference station and reference arm and reference direction. In operation 914, a properly positioned wafer is picked at the reference station. In one embodiment, the wafer is properly positioned by using an aligner.

In operation 916, the method passes the wafer previously picked through the different facets of the stations, and offsets for extend and retract are measured as the robot passes the wafer into and out of the stations with each arm. Operation 918 creates an offset table to compensate for differences between the measured extend and retract offsets and the nominal sensor locations. One embodiment for this operation was previously described with respect to FIGS. 5 and 6. In operation 920, the robot values are adjusted by performing a station value optimization step adjusted with the calculated values for the offset table. In operation 922, the offset table is fine tuned by obtaining data from repeatedly placing and picking of the wafer.

Figure 11C:
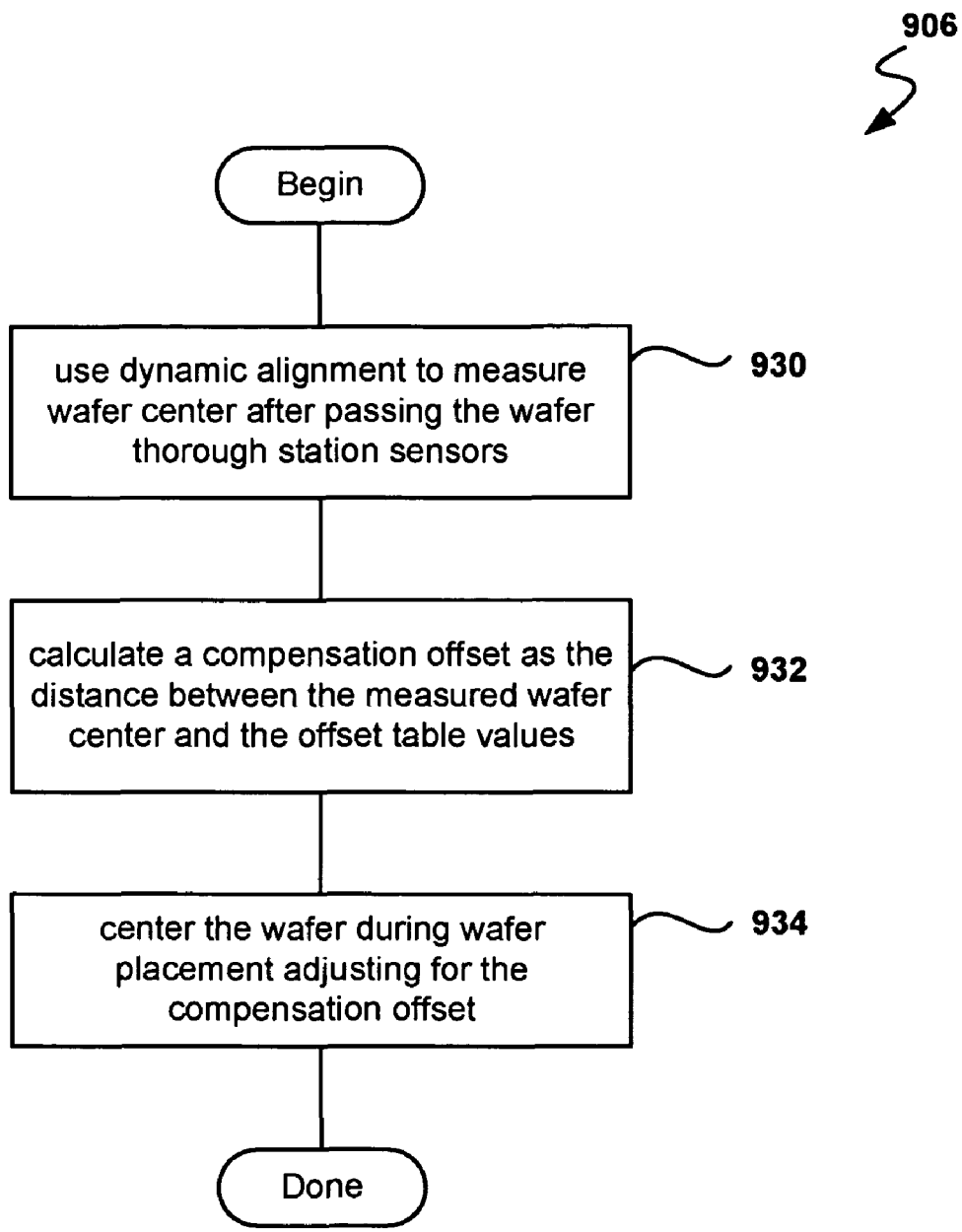

FIG. 11C describes in more details operation 906 from FIG. 11A to place wafers in the stations during manufacturing using the compensation parameters. In operation 930, a dynamic alignment algorithm is used to measure wafer center after passing the wafer through sensors. While placing to station in one embodiment, Offset (Measured RO,TO) is measured for the appropriate facet and direction. In operation 932, the appropriate value from the offset table (station, extend direction, arm) is used to calculate where wafer center is relative to the calibrated station center, which is called the DAIII Offset, (DAIII RO,TO). The DAIII Offset is used to determine the Compensation Offset, (Compensation RO,TO), which is the distance between measured wafer center and the offset table value.

$(DAIII\ RO,TO) = $ (Measured $RO,TO$) − (Offset Table $Ce/rR, Ce/rT)_{station, arm, direction}$ = −(Compensation $RO,TO$)

In operation 934, Compensation Offset is used during the 'place' command. In one embodiment, the retract offset is graphed on dynamic alignment charts. The measured vector equation is obtained by adding the Compensation and Tabulated vectors.

Figure 11D:
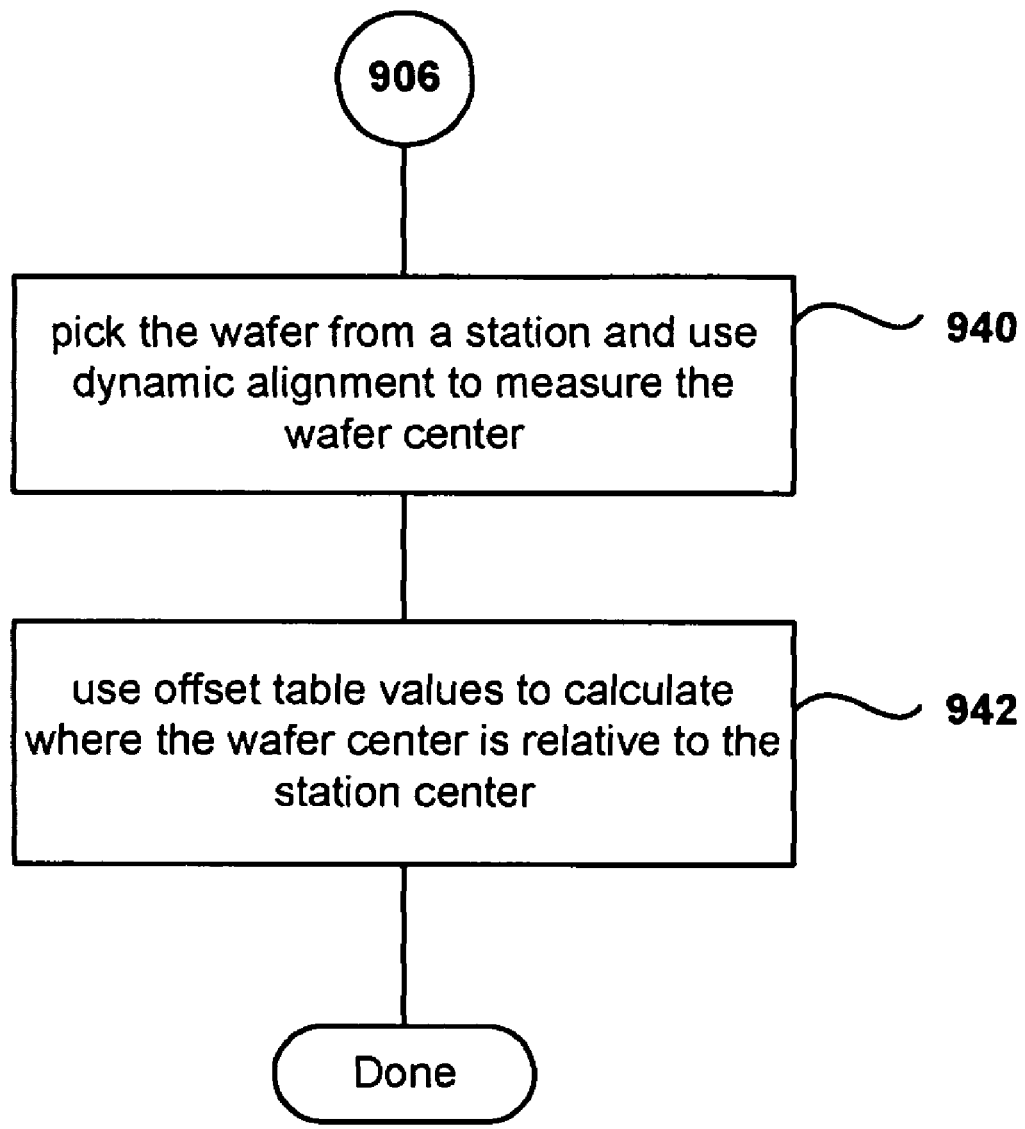
Figure 12:
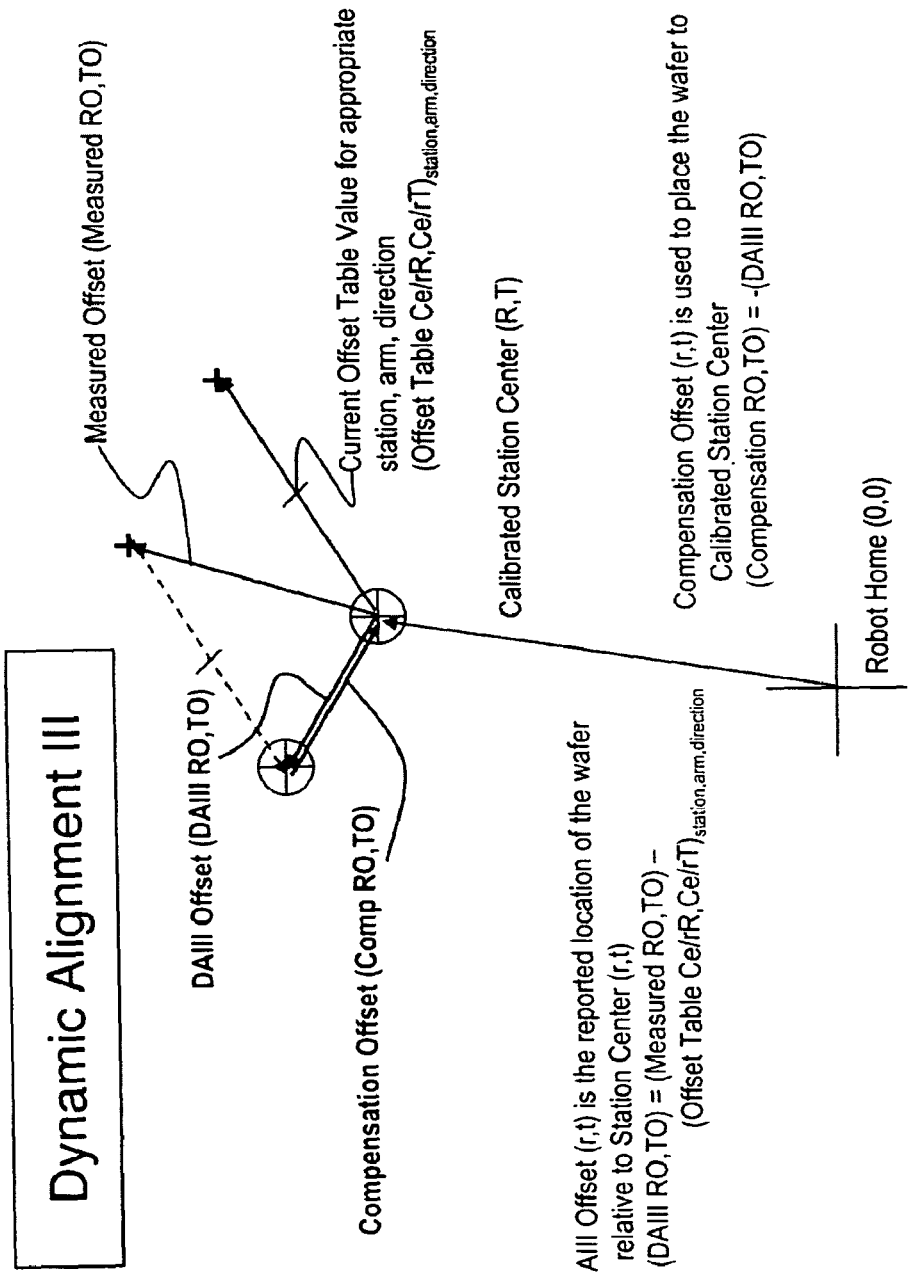
FIG. 12 describes pictorially the use of Dynamic Alignment III according to the method described in FIG. 11D.

FIG. 11D depicts the process for measuring wafer position when picking a wafer from a station. After operation 906 in FIG. 1, operation 940 picks the wafer from a station and dynamic alignment is used to measure the DAIII Offset. In one embodiment, this value is graphed on dynamic alignment charts. In operation 942, the appropriate value from the offset table (station, retract direction, arm) is used to calculate where wafer center is relative to station center. FIG. 12 describes pictorially the use of Dynamic Alignment III according to the method described in FIG. 11D.

$(DAIII\ RO,TO) = $ (Measured $RO,TO$) − (Offset Table $Ce/rR, Ce/rT)_{station, arm, direction}$ The Compensation Offset (r,t) is used to place the wafer to Calibrated Station Center. DAIII Offset (r,t) is the reported location of the wafer relative to Station Center (r,t).

Embodiments of the present invention may be practiced with various computer system configurations including handheld devices, microprocessor systems, microprocessor-based or programmable consumer electronics, minicomputers, mainframe computers and the like. The invention can also be practiced in distributed computing environments where tasks are performed by remote processing devices that are linked through a wire-based or wireless network.

With the above embodiments in mind, it should be understood that the invention can employ various computer-implemented operations involving data stored in computer systems. These operations are those requiring physical manipulation of physical quantities.

Any of the operations described herein that form part of the invention are useful machine operations. The invention also relates to a device or an apparatus for performing these operations. The apparatus can be specially constructed for the required purpose, or the apparatus can be a general-purpose computer selectively activated or configured by a computer program stored in the computer. In particular, various general-purpose machines can be used with computer programs written in accordance with the teachings herein, or it may be more convenient to construct a more specialized apparatus to perform the required operations.

Although the method operations were described in a specific order, it should be understood that other housekeeping operations may be performed in between operations, or operations may be adjusted so that they occur at slightly different times, or may be distributed in a system which allows the occurrence of the processing operations at various intervals associated with the processing, as long as the processing of the overlay operations are performed in the desired way.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method to optimize wafer placement repeatability in a system with semiconductor manufacturing equipment using a controlled series of wafer movements, the method comprising:
    (a) performing a preliminary station calibration to teach a robot position for each station interfaced to facets of a vacuum transfer module (VTM) used in semiconductor manufacturing;
    (b) calibrating the system to obtain compensation parameters that take into account the station where the wafer is to be placed, position of sensors in each facet, and offsets derived from performing extend and retract operations of a robot arm, the calibrating further including accessing a table having nominal sensor locations for each facet, and creating an offset table to compensate for error induced by the nominal sensor locations;
    (c) fine tuning the compensation parameters and robot position for each station by obtaining data from placing and picking of the wafer; and
    (d) placing wafers in stations during manufacturing using the compensation parameters.

2. A method to optimize wafer placement repeatability in a system with semiconductor manufacturing equipment using a controlled series of wafer movements, the method comprising:
    (a) performing a preliminary station calibration to teach a robot position for each station interfaced to facets of a vacuum transfer module (VTM) used in semiconductor manufacturing;
    (b) calibrating the system to obtain compensation parameters that take into account the station where the wafer is to be placed, position of sensors in each facet, and offsets derived from performing extend and retract operations of a robot arm;
    (c) placing wafers in stations during manufacturing using the compensation parameters, wherein operations (a) and (b) are performed with a first arm identified as a reference arm of the robot;
    (d) performing operations (a) and (b) with a second arm of the robot;
    (e) dropping off a picked wafer once to swap arms after performing operation (a) with the first arm and before performing operation (a) with the second arm, the dropping being performing at a reduced speed to reduce effects of wafer shifting; and
    (f) dropping off the picked wafer once to swap arms after performing operation (b) with the first arm and before performing operation (b) with the second arm.

3. A method to optimize wafer placement repeatability in a system with semiconductor manufacturing equipment using a controlled series of wafer movements, the method comprising:
    (a) performing a preliminary station calibration to teach a robot position for each station interfaced to facets of a vacuum transfer module (VTM) used in semiconductor manufacturing;
    (b) calibrating the system to obtain compensation parameters that take into account the station where the wafer is to be placed, position of sensors in each facet, and offsets derived from performing extend and retract operations of a robot arm, wherein operation (b) further includes:

(i) accessing a table having nominal sensor locations for each facet;
(ii) identifying a reference station, a reference transfer direction, and a reference robot arm;
(iii) picking at the reference station a wafer that is known to be properly positioned;
(iv) passing the picked wafer through the facets and measuring extend and retract offsets when the robot passes the wafer into and out of the stations with each arm;
(v) creating an offset table to compensate for repeatable measurement error induced by differences between extend and retract direction, as well as error induced by using nominal sensor locations; and
(vi) adjusting robot values for each station;
(c) placing wafers in stations during manufacturing using the compensation parameters, wherein operations (a) and (b) are performed with a first arm identified as a reference arm of the robot; and
(d) performing operations (a) and (b) with a second arm of the robot.

4. The method as recited in claim 3, wherein rows in the offset table include,
an identifier for a combination of station and arm used,
a pair of values associated with an extend operation, the pair of values including a radius and an angle, and
a pair of values associated with a retract operation.

5. The method as recited in claim 4, wherein operation (b) further comprises:
(vii) refining station locations using metrology based alignment; and
(viii) fine tuning offset table values and robot position for each station by obtaining data from repeatedly placing and picking of the wafer.

6. The method as recited in claim 5, wherein (viii) fine tuning the offset table values further includes,
performing multiple measurements of each combination for placing the wafer with one arm and then picking up the wafer with the same or a different arm,
getting a cluster of values from the multiple measurements for each combination, and
calculating a representative value for each cluster associated with each combination to adjust a second arm placement position and the retract values in the offset table.

7. The method as recited in claim 4, wherein operation (c) further includes,
using dynamic alignment to measure wafer center after passing the wafer thorough station sensors;
calculating a compensation offset as a distance between the measured wafer center and the offset table values; and
centering the wafer during wafer placement adjusting for the compensation offset.

8. The method as recited in claim 4, further comprising
(e) measuring wafer position when picking the wafer from a station, the measuring wafer position including,
(i) picking the wafer from a station and using dynamic alignment to measure the wafer center, and
(ii) using offset table values to calculate where the wafer center is relative to a station center.

9. The method as recited in claim 4, wherein rows in the table having nominal sensor locations include,
a station identification,
a sensor identification,
a radius value, and
an angle value.

10. The method as recited in claim 1, wherein (a) further includes,
using dynamic alignment to teach the robot position in each station.

11. A method to optimize wafer placement repeatability in a system with semiconductor manufacturing equipment using a controlled series of wafer movements, the method comprising:
(a) performing a preliminary station calibration to teach a robot position for each station interfaced to facets of a VTM used in semiconductor manufacturing;
(b) calibrating the system, the calibrating including,
(i) accessing a table having nominal sensor locations for each facet;
(ii) identifying a reference station, a reference transfer direction, and a reference robot arm;
(iii) picking at the reference station a wafer that is known to be properly positioned;
(iv) passing the picked wafer through the facets and measuring extend and retract offsets when the robot passes the wafer into and out of the stations with each arm;
(v) creating an offset table to compensate for repeatable measurement error induced by differences between extend and retract direction, as well as error induced by using nominal sensor locations; and
(vi) adjusting robot values for each station; and
(c) placing wafers in stations during manufacturing using calibration results.

12. The method as recited in claim 11 wherein operations (a) and (b) are performed with a first arm identified as a reference arm of the robot, the method further comprising performing operations (a) and (b) with a second arm of the robot.

13. The method as recited in claim 11, wherein operation (b) further includes,
(vii) refining station locations using metrology based alignment.

14. The method as recited in claim 11, wherein operation (b) further includes,
(viii) fine tuning offset table values and robot position for each station by obtaining data from repeatedly placing and picking of the wafer.

15. The method as recited in claim 11, wherein during operation (b) the wafer is replaced by a calibration fixture.

16. A method to optimize wafer placement repeatability in a system with semiconductor manufacturing equipment using a controlled series of wafer movements, the method comprising:
(a) performing a preliminary station calibration to teach a robot position for each station interfaced to facets of a VTM used in semiconductor manufacturing;
(b) calibrating the system, the calibrating including,
(i) accessing a table having nominal sensor locations for each facet;
(ii) identifying one of the stations as a reference station;
(iii) picking at the reference station a wafer that is known to be properly positioned;
(iv) passing the picked wafer through the facets and measuring extend and retract offsets when the robot passes the wafer into and out of the stations;
(v) creating an offset table to compensate for repeatable measurement error induced by differences between extend and retract direction, as well as error induced by using the nominal sensor locations;
(vi) adjusting robot values for each station;

(vii) refining station locations using metrology based alignment; and
(viii) fine tuning offset table values and robot position for each station by obtaining data from repeatedly placing and picking of the wafer; and
(c) placing wafers in stations during manufacturing using calibration results.

17. The method as recited in claim 16,
wherein the passing the picked wafer of (iv) is repeated multiple times through each facet, and
wherein the creating the offset table of (v) is performed by averaging the results from the passing the picked wafer multiple times in (iv).

18. The method as recited in claim 16, wherein the wafer is properly positioned in (iii) by centering the wafer in the reference station using an aligner.

19. The method as recited in claim 16, wherein a vertical velocity of the robot is reduced at the beginning of each operation in (b).

20. The method as recited in claim 16 wherein operations (a) and (b) are performed with a first arm identified as a reference arm of the robot, the method further comprising performing operations (a) and (b) with a second arm of the robot.

21. The method as recited in claim 20, wherein operation (viii) further includes,
performing multiple measurements of different combinations for placing the wafer with one arm and then picking up the wafer with the same or a different arm,
getting a cluster of values from the multiple measurements for each combination, and
calculating a representative value for each cluster associated with each combination to adjust a second arm placement position and retract values in the offset table.

22. A system to optimize wafer placement repeatability in semiconductor manufacturing equipment using a controlled series of wafer movements, comprising:
a vacuum transfer module (VTM) used in semiconductor manufacturing;
a robot in the VTM;
a plurality of stations interfaced to facets in the VTM;
a plurality of sensors in each facet;
a computer device having a processor;
a display to show results of the wafer movements; and
a memory, the memory including,
a wafer placement program,
a table having nominal sensor locations for each facet,
an offset table, and
fine tuning values for station locations;
wherein program instructions from the wafer placement program when executed by the processor cause the processor to,
(a) perform a preliminary station calibration to teach a robot position for each station;
(b) calibrate the system, which causes the processor to,
(i) access the table having nominal sensor locations;
(ii) identify one of the stations as a reference station;
(iii) pick at the reference station a wafer that is known to be properly positioned;
(iv) pass the picked wafer through the plurality of facets and measuring the extend and retract offsets when the robot passes the wafer into and out of the stations;
(v) create the offset table to compensate for repeatable measurement error induced by differences between extend and retract direction, as well as error induced by using nominal sensor locations;
(vi) adjust robot values for each station;
(vii) refine the station locations using metrology based alignment; and
(viii) fine tune offset table values and robot position for each station by obtaining data from repeatedly placing and picking of the wafer; and
(c) place wafers in stations during manufacturing using calibration results.

\* \* \* \* \*